(12) United States Patent
Meyer et al.

(10) Patent No.: US 9,856,136 B2
(45) Date of Patent: Jan. 2, 2018

(54) CHIP ARRANGEMENT AND METHOD FOR MANUFACTURING A CHIP ARRANGEMENT

(71) Applicant: Intel Mobile Communications GmbH, Neubiberg (DE)

(72) Inventors: Thorsten Meyer, Regensburg (DE); Gerald Ofner, Regensburg (DE); Christian Mueller, Bottrop (DE); Reinhard Mahnkopf, Oberhaching (DE); Christian Geissler, Teugn (DE); Andreas Augustin, Munich (DE)

(73) Assignee: Intel Deutschland GmbH, Neubiberg (DE)

( * ) Notice: Subject to any disclaimer, the term of this patent is extended or adjusted under 35 U.S.C. 154(b) by 0 days.

(21) Appl. No.: 13/910,133

(22) Filed: Jun. 5, 2013

(65) Prior Publication Data

US 2014/0361387 A1 Dec. 11, 2014

(51) Int. Cl.
*H01L 29/84* (2006.01)
*B81B 7/00* (2006.01)
(Continued)

(52) U.S. Cl.
CPC ............ *B81B 7/0077* (2013.01); *B81B 7/007* (2013.01); *B81C 1/00333* (2013.01); *H01L 24/19* (2013.01); *B81B 2207/012* (2013.01); *B81B 2207/095* (2013.01); *H01L 2224/04105* (2013.01); *H01L 2224/12105* (2013.01); *H01L 2224/16146* (2013.01); *H01L 2224/16227* (2013.01); *H01L 2224/24137* (2013.01); *H01L 2224/32145* (2013.01); *H01L 2224/48091* (2013.01); *H01L 2224/48137* (2013.01); *H01L 2224/48145* (2013.01); *H01L 2224/48227* (2013.01); *H01L 2224/73259* (2013.01); *H01L 2224/73267* (2013.01); *H01L 2924/1431* (2013.01); *H01L 2924/1461* (2013.01); *H01L 2924/15311* (2013.01); *H01L 2924/181* (2013.01)

(58) Field of Classification Search
CPC . H01L 2224/48091; H01L 2224/48137; H01L 2924/181; H01L 2924/00014
USPC .................................. 257/415, 233, 253, 254
See application file for complete search history.

(56) References Cited

U.S. PATENT DOCUMENTS 8,154,115 B1  4/2012  Chan et al.
8,237,259 B2  8/2012  Pressel et al.
(Continued)

FOREIGN PATENT DOCUMENTS

CN   202587367 U   12/2012
CN   102958826 A   3/2013
(Continued)

OTHER PUBLICATIONS

European Search Report received for EP application No. 14170700.0 (3 pages), dated Dec. 24, 2014.
(Continued)

*Primary Examiner* — Tan N Tran
(74) *Attorney, Agent, or Firm* — Viering, Jentschura & Partner mbB

(57) ABSTRACT

A chip arrangement may include: a mold compound; and a microelectromechanical systems device at least partially embedded in the mold compound.

34 Claims, 10 Drawing Sheets

(51) Int. Cl.
  *B81C 1/00*  (2006.01)
  *H01L 23/00*  (2006.01)

(56) References Cited

U.S. PATENT DOCUMENTS

| | | | |
|---|---|---|---|
| 8,604,568 B2* | 12/2013 | Stacey | 257/417 |
| 8,865,499 B2 | 10/2014 | Pahl et al. | |
| 8,983,107 B2 | 3/2015 | Liu | |
| 9,048,811 B2* | 6/2015 | Chen | H03H 3/007 |
| 2007/0069354 A1* | 3/2007 | Dangelmaier | B81B 7/0058 257/678 |
| 2008/0083958 A1 | 4/2008 | Wei et al. | |
| 2008/0179697 A1* | 7/2008 | Cortese | B81B 7/0061 257/415 |
| 2008/0283942 A1* | 11/2008 | Huang et al. | 257/415 |
| 2008/0308917 A1 | 12/2008 | Pressel et al. | |
| 2009/0134481 A1* | 5/2009 | Sengupta | B81C 1/00333 257/415 |
| 2010/0284553 A1* | 11/2010 | Conti et al. | 381/174 |
| 2010/0289133 A1 | 11/2010 | Chao et al. | |
| 2011/0180926 A1 | 7/2011 | Shah et al. | |
| 2011/0210450 A1 | 9/2011 | Theuss et al. | |
| 2012/0032285 A1* | 2/2012 | Cortese et al. | 257/416 |
| 2012/0139068 A1 | 6/2012 | Stacey | |
| 2013/0032936 A1 | 2/2013 | Formosa | |
| 2013/0075888 A1 | 3/2013 | Chang et al. | |
| 2013/0140656 A1 | 6/2013 | Pahl et al. | |
| 2013/0216068 A1 | 8/2013 | Liu | |
| 2014/0042565 A1* | 2/2014 | Fuergut et al. | 257/416 |
| 2014/0264831 A1 | 9/2014 | Meyer | |

FOREIGN PATENT DOCUMENTS

| | | |
|---|---|---|
| CN | 104051365 A | 9/2014 |
| DE | 102008025223 A1 | 12/2008 |

OTHER PUBLICATIONS

Office Action received for the corresponding Chinese patent application serial No. 201410244973X, dated May 9, 2016, 9 pages, for reference purposes only.

* cited by examiner

CHIP ARRANGEMENT AND METHOD FOR MANUFACTURING A CHIP ARRANGEMENT

TECHNICAL FIELD

Various aspects relate to a chip arrangement and a method for manufacturing a chip arrangement.

BACKGROUND

A chip (or die) may be packaged prior to distribution and/or integration with other electronic assemblies. Packaging a chip (or die) may include encapsulating or embedding the chip in a material, and may further include providing an interface to the encapsulated or embedded chip, for example by means of electrical contacts (e.g. formed on the exterior of the chip package). A chip package may protect the embedded chip from ambient atmosphere and/or contaminants, provide mechanical support to the embedded chip, disperse heat in the embedded chip, and reduce mechanical damage to the embedded chip, although other uses of the chip package may be possible as well.

As the demand for greater capabilities and features of chip packages increases, chips including sensors, oscillators, surface acoustic wave (SAW) structures, bulk acoustic wave (BAW) structures and/or other microelectromechanical systems (MEMS) structures may be packaged. Such chips may also be referred to as MEMS devices. Chip packages including MEMS devices may have a large thickness and/or a large lateral extent (which may also be referred to as "package footprint"). Such chip packages may be undesirable for future technology nodes, which seem to show a trend towards smaller thicknesses and/or smaller package footprints. New ways of packaging MEMS devices may be needed.

SUMMARY

A chip arrangement is provided, which may include: a mold compound; and a microelectromechanical systems device at least partially embedded in the mold compound.

A method for manufacturing a chip arrangement is provided, which may include: disposing a microelectromechanical systems device over a carrier; and at least partially embedding the microelectromechanical systems device in a mold compound.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1A:
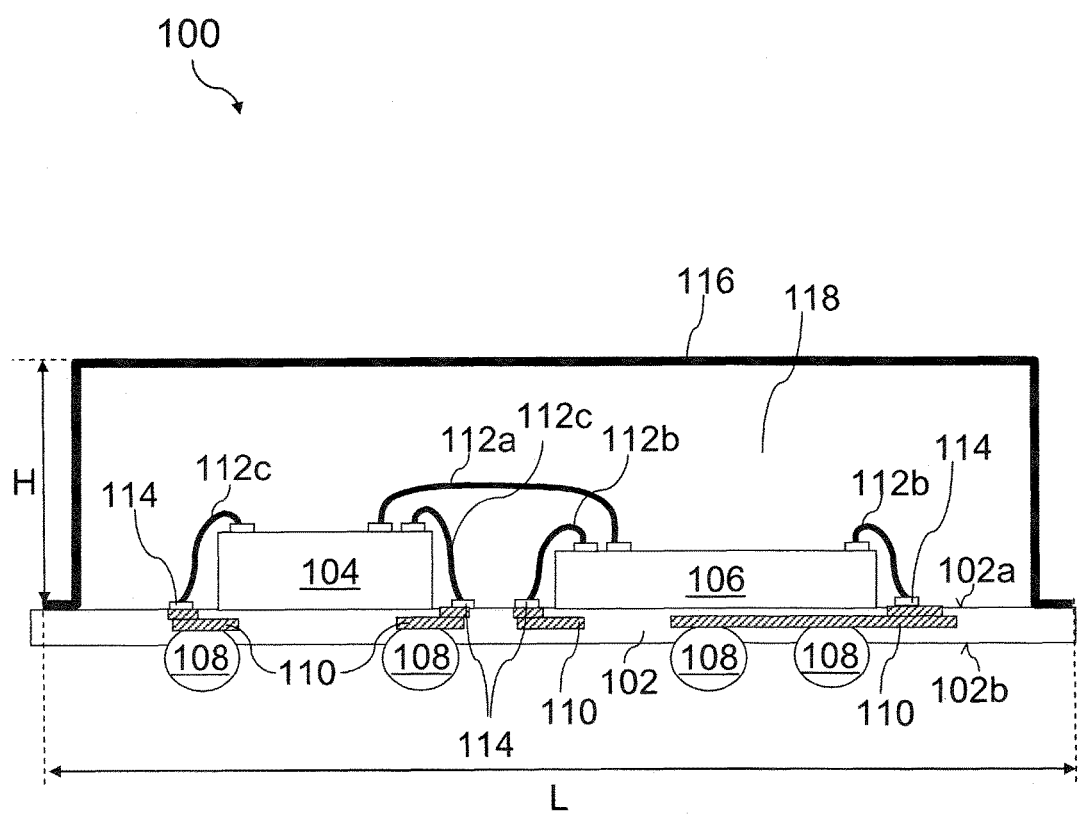
FIG. 1A shows an integrated circuit (IC) package including a substrate, a microelectromechanical systems (MEMS) device disposed laterally adjacent to a semiconductor chip and over the substrate, and wire bonding coupled to the MEMS device and the semiconductor chip.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described for structures or devices, and various aspects are described for methods. It may be understood that one or more (e.g. all) aspects described in connection with structures or devices may be equally applicable to the methods, and vice versa.

The word "exemplary" is used herein to mean "serving as an example, instance, or illustration". Any aspect or design described herein as "exemplary" is not necessarily to be construed as preferred or advantageous over other aspects or designs.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The terms "coupled" and/or "electrically coupled" and/or "connected" and/or "electrically connected", used herein to describe a feature being connected to at least one other implied feature, are not meant to mean that the feature and the at least one other implied feature must be directly coupled or connected together; intervening features may be provided between the feature and at least one other implied feature.

Directional terminology, such as e.g. "upper", "lower", "top", "bottom", "left-hand", "right-hand", etc., may be used with reference to the orientation of figure(s) being described. Because components of the figure(s) may be positioned in a number of different orientations, the directional terminology is used for purposes of illustration and is in no way limiting. It is to be understood that structural or logical changes may be made without departing from the scope of the invention.

Use of microelectromechanical systems (MEMS) devices (e.g. chips including sensors, accelerometers, oscillators, surface acoustic wave (SAW) structures, bulk acoustic wave (BAW) structures and/or other MEMS structures) may be growing in the global semiconductor business. For example, MEMS devices are increasingly being used in mobile communications (e.g. in mobile telephones, global positioning systems (GPS) modules, etc.), computing (e.g. in tablet computers), and other industries.

A MEMS device may be used with a semiconductor chip. The semiconductor chip may include, or may be, at least one of a logic chip, an application-specific integrated circuit (ASIC), a memory chip, an active device (e.g. a transistor), and a passive device (e.g. a resistor and/or capacitor and/or inductor). The semiconductor chip (e.g. active device, logic chip and/or ASIC) may, for example, control an operation of the MEMS device. By way of another example, data (e.g. measurements) from a MEMS device may be provided to the semiconductor chip (e.g. memory chip and/or passive device).

With industry trends moving towards smaller and/or single integrated circuit (IC) packages, a MEMS device may be packaged (e.g. with a semiconductor chip) as (or as part of) an IC package. A packaging technology most widely used in today's IC packages including a MEMS device may be wire bonding.

FIG. 1A shows an IC package 100 including a substrate 102, a MEMS device 104 disposed laterally adjacent to a semiconductor chip 106 and over the substrate 102, and wire bonding 112a, 112b, 112c electrically connected to the MEMS device 104 and the semiconductor chip 106.

The substrate 102 of the IC package 100, which may be formed by a lamination or pressing process, may include, or may consist of, a laminate material (which may also referred to as "a laminate"). By way of another example, the substrate 102 may include, or may consist of, an epoxy polymer containing a filler material (e.g. glass fiber). By way of yet another example, the substrate 102 may include, or may consist of, FR4 and/or bis-maleimide triazine (BT). By way of yet another example, the substrate 102 may include, or may consist of, an organic resin and/or a ceramic material.

The substrate 102 may have a first side 102a and a second side 102b opposite the first side. The MEMS device 104 and the semiconductor chip 106 may be disposed at (e.g. disposed on or over) the first side 102a of the substrate 102, as shown in FIG. 1A. The IC package 100 may include at least one electrical connector 108 (e.g. at least one solder ball) disposed at the second side 102b of the substrate 102. The MEMS device 104 and/or the semiconductor chip 106 may be electrically connected to the at least one electrical connector 108 (e.g. at least one solder ball) by means of wire bonding 112a, 112b, 112c and a redistribution layer (RDL) 110. The RDL 110 may be partially or fully disposed within the substrate 102, and may redistribute and/or re-map electrical connections from the MEMS device 104 and/or the semiconductor chip 106 to the at least one electrical connector 108.

The IC package 100 may include wire bonding 112a, which may electrically connect the MEMS device 104 and the semiconductor chip 106 to each other. The wire bonding 112a may be a means by which the semiconductor chip 106 provides electrical signals to the MEMS device 104, for example to control an operation of the MEMS device 104 and/or a means by which the MEMS device 104 provides the semiconductor chip 106 with electrical signals (e.g. data, e.g. measurements).

The IC package 100 may include wire bonding 112b, which may electrically connect the semiconductor chip 106 to the RDL 110, for example via at least one electrically conductive pad 114 disposed at (e.g. disposed on or over) the first side 102a of the substrate 102.

The IC package 100 may include wire bonding 112c, which may electrically connect the MEMS device 104 to the RDL 110, for example via at least one electrically conductive pad 114 disposed at (e.g. disposed on or over) the first side 102a of the substrate 102.

The wire bonding 112a, 112b, 112c, the at least one electrically conductive pad 114, the RDL 110, and the at least one electrical connector 108 may provide an interface (e.g. an electrical interface) for the MEMS device 104 and/or the semiconductor chip 106. In other words, signals (e.g. electrical signals, power supply potentials, ground potentials, etc.) may be exchanged with the MEMS device 104 and/or the semiconductor chip 106 via the at least one electrical connector 108, the RDL 110, the at least one electrically conductive pad 114, and the wire bonding 112a, 112b, 112c.

The IC package 100 may include a cap 116 that may seal and/or shield the MEMS device 104 and the semiconductor chip 106 within a cavity 118. In other words, the MEMS device 104 and/or the semiconductor chip 106 may be housed within the cap 116, and may have a margin (e.g. a gap, e.g. an air gap) disposed at least over the MEMS device 104 and/or the semiconductor chip 106 and/or the wire bonding 112a, 112b, 112c.

Whilst wire bonding packaging technology may be widely used in the IC package 100 (e.g. as part of an interface for the MEMS device 104 and/or the semiconductor chip 106), a time required to form each wire bond of the wire bonding 112a, 112b, 112c may be slow. This may, for example, be caused by a need to form a point-to-point connection for each wire bond of the wire bonding 112a, 112b, 112c. This may, in turn, increase a time required to manufacture the IC package 100.

Furthermore, a length of the interconnect provided by the wire bonding 112a and/or the wire bonding 112b and/or the wire bonding 112c may be long. The increased length of the wire bonding 112a, 112b, 112c may lead to degraded electrical performance (e.g. degraded resistivity, conductance, inductivity, capacitance) of the wire bonding 112a, 112b, 112c and, consequently, of the IC package 100. The degraded electrical performance of the IC package 100 may not be suitable for future technology nodes, which may require the MEMS device 104 and/or the semiconductor chip 106 to be contacted (e.g. electrically contacted) by means of an interface having reliable electrical performance.

Even further, the MEMS device 104, the semiconductor chip 106 and the wire bonding 112a, 112b, 112c may occupy area on the substrate 102. This may increase a lateral extent L (e.g. a footprint) of the IC package 100. The increased footprint L may be more pronounced in examples where the IC package 100 may include a plurality of semiconductor chips 106 and/or a plurality of MEMS devices 104. For example, the IC package 100 may include, or may be, an inertial measurement unit (IMU) that may include a MEMS device 104 configured as an accelerometer, another MEMS device 104 configured as a gyroscope, and at least one semiconductor chip 106 (e.g. logic chip, ASIC, passive device), which are disposed next to each other and over the substrate 102. Yet further, a height H of the IC package 100 may be increased due to, for example, an arc (e.g. a loop, e.g. a wire loop) of the wire bonding 112a, 112b, 112c and/or a margin (e.g. a gap, e.g. an air gap) that may be provided over the MEMS device 104 and/or the semiconductor chip 106 and/or the wire bonding 112a, 112b, 112c, which may be housed within the cap 116 of the IC package 100. Consequently, the footprint L occupied by the IC package 100 and/or a thickness (e.g. height H) of the IC package 100 may be large, and may not be suitable for future technology nodes, which seem to show a trend towards smaller thicknesses and/or smaller package footprints.

Figure 1B:
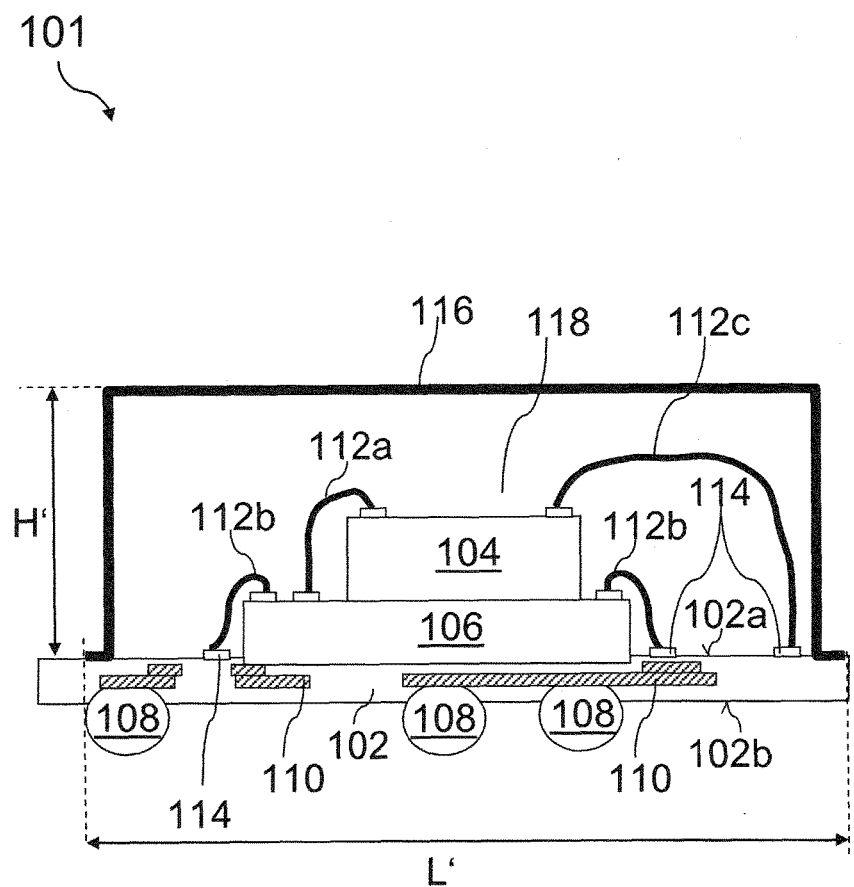
FIG. 1B shows an IC package including a substrate, a semiconductor chip disposed over the substrate, and a MEMS device disposed over the semiconductor chip.

FIG. 1B shows an IC package 101 including the substrate 102, the semiconductor chip 106 disposed over the substrate 102, and the MEMS device 104 disposed over the semiconductor chip 106.

Reference signs in FIG. 1B that are the same as in FIG. 1A denote the same or similar elements as in FIG. 1A. Thus, those elements will not be described in detail again here; reference is made to the description above. The various considerations described above in relation to the IC package 100 shown in FIG. 1A may be analogously valid for the IC package 101 shown in FIG. 1B. Differences between FIG. 1B and FIG. 1A are described below.

In the IC package 101 shown in FIG. 1B, the MEMS device 104 may be disposed over (e.g. stacked and/or mounted over) the semiconductor chip 106. In such an example, the footprint L' of the IC package 101 may be reduced compared with the IC package 100 shown in FIG. 1A.

However, the wire bonding 112a, 112b, 112c may still occupy area on the substrate 102 and/or may still include an arc (e.g. a loop, e.g. a wire loop). Furthermore, a margin (e.g. a gap, e.g. an air gap) may still be provided over the MEMS device 104 disposed over the semiconductor chip 106 and/or the wire bonding 112a, 112b, 112c. Consequently, disposing (e.g. stacking and/or mounting) the MEMS device 104 over the semiconductor chip 106, whilst decreasing the footprint of the IC package 101 (indicated as lateral extent L' in FIG. 1B), may increase a height and/or thickness of the IC package 101 (indicated as height H' in FIG. 1B). Even further, disposing (e.g. stacking and/or mounting) the MEMS device 104 over the semiconductor chip 106 may prevent a stacking of another semiconductor chip 106. Accordingly, the IC package 101 may not be suitable for IC packages that may include a plurality of semiconductor chips 106 and/or IC packages that may require smaller thicknesses.

Instead of the wire bonding 112a, 112b, 112c used in the IC packages 100 and 101, a flip chip packaging may be used. In such an example, the substrate 102 may be selected according the most stringent design rules. Typically, the most stringent design rules may apply to the semiconductor chip 106 (e.g. logic chip, ASIC), and this may result in a use of a high-cost substrate 102. In such an example, the MEMS device 104 may occupy area on the high-cost substrate 102 that may otherwise be used for additional circuitry or eliminated to reduce the footprint of the IC package. Even if the MEMS device 104 may be disposed over (e.g. stacked and/or mounted over) the semiconductor chip 106 (e.g. logic chip, ASIC) in the flip chip packaging, a height and/or thickness of the IC package including the flip chip packaging may be large.

Instead of the wire bonding 112a, 112b, 112c used in the IC packages 100 and 101, the MEMS device 104 may include through-silicon-vias (TSVs) that may extend through at least a part of the MEMS device 104. However, forming the TSVs may incur high manufacturing costs. Further, the TSVs may suffer from low yield.

In view of the above-mentioned considerations, the following needs may be identified:

There may be a need to provide a chip arrangement including a packaged MEMS device that may have a small lateral extent (e.g. a small footprint).

There may be a need to provide a chip arrangement including a packaged MEMS device that may have a small height and/or thickness.

There may be a need to provide a chip arrangement including a packaged MEMS device that may contacted (e.g. electrically contacted) by means of an interconnect having reliable electrical performance (e.g. lower resistance and/or capacity and/or inductivity).

There may be a need to provide a chip arrangement including a packaged MEMS device that may be manufactured in a short time duration.

Figure 2:
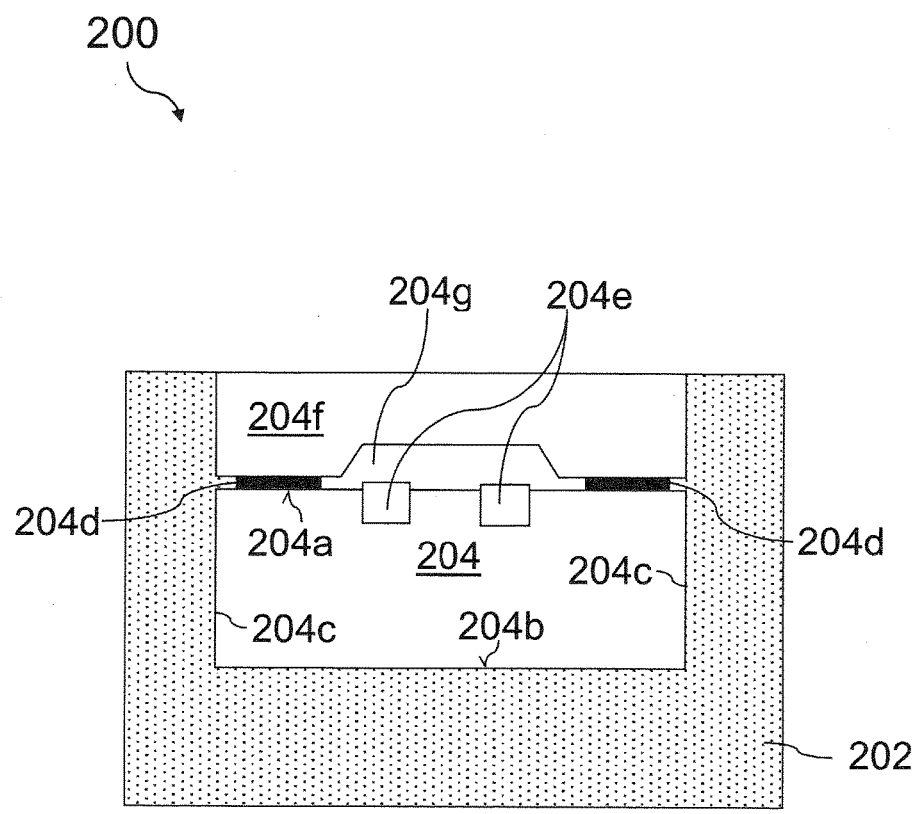
FIG. 2 show a chip arrangement including a mold compound and a MEMS device at least partially embedded in the mold compound.

Such a chip arrangement may, for example, be provided by means of the chip arrangement 200 shown in FIG. 2.

FIG. 2 shows a chip arrangement 200 including a mold compound 202 and a MEMS device 204 at least partially embedded in the mold compound 202.

Only one MEMS device 204 is shown as an example, however the number of MEMS devices 204 may be greater than one, and may, for example, be two, three, four, five, etc. For example, the chip arrangement 200 may include a plurality of MEMS devices 204, which may, for example, be arranged laterally adjacent to each other.

The MEMS device 204 may include a semiconductor substrate, which may include, or may consist of, a semiconductor material. The semiconductor material may include, or may be, at least one material selected from a group of materials, the group consisting of: silicon, germanium, gallium nitride, gallium arsenide, and silicon carbide, although other materials may be possible as well.

The MEMS device 204 may have a first side 204a and a second side 204b opposite the first side 204a. The MEMS device 204 may further have at least one sidewall 204c. The MEMS device 204 may include at least one electrically conductive contact 204d, which may be disposed at the first side 204a of the MEMS device 204. The at least one electrically conductive contact 204d of the MEMS device 204 may include, or may be, a pad (e.g. a bonding and/or contact pad). The at least one electrically conductive contact 204d of the MEMS device 204 may provide an interface (e.g. an electrical interface) for the MEMS device 204. In other words, signals (e.g. electrical signals, power supply potentials, ground potentials, etc.) may be exchanged with the MEMS device 204 via the at least one electrically conductive contact 204d.

The MEMS device 204 may include at least one MEMS structure 204e, which may be disposed at the first side 204a of the MEMS device 204. Only two MEMS structures 204e are shown as an example, however the number of MEMS structures 204e may be one, or may be greater than two, and may, for example, be three, four, five, etc. The first side 204a of the MEMS device 204, at which the at least one MEMS structure 204e may be disposed, may be referred to as an active side of the MEMS device 204.

The at least one MEMS structure 204e may include, or may be, at least one of a sensor, an accelerometer, an oscillator, a surface acoustic wave (SAW) structure, and a bulk acoustic wave (BAW) structures, although other MEMS structures may be possible as well.

The MEMS device 204 may include a cap 204f. The cap 204f may be configured to encapsulate the at least one MEMS structure 204e, for example, within a cavity 204g. The cap 204f may seal and/or shield the at least one MEMS structure 204e, for example, within the cavity 204g. The cap 204f may seal and/or shield the at least one MEMS structure 204e from, for example, moisture, dust and/or mechanical damage. The cap 204f may seal the at least one MEMS structure 204e by means of a seal disposed at a periphery of the cap 204f. In the example shown in FIG. 2, the at least one electrically conductive contact 204d may be a means by which the cap 204f may seal the at least one MEMS structure 204e. In another example, a structure other than the at least one electrically conductive contact 204d may be a means by which the cap 204f may seal the at least one MEMS structure 204e.

The cap 204f may be disposed over at least a part of the first side 204a (e.g. active side) of the MEMS device 204. For example, in the chip arrangement 200 shown in FIG. 2, the cap 204f may be disposed over a lateral extent of the first side 204a of the MEMS device 204. In another example, the cap 204f may be disposed over a part of the first side 204a of the MEMS device 204, and another part of the first side 204a of the MEMS device 204 may be free from the cap 204f.

The cap 204f may include a semiconductor substrate, which may include, or may consist of, a semiconductor material. The semiconductor material may include, or may be, at least one material selected from a group of materials, the group consisting of: silicon, germanium, gallium nitride, gallium arsenide, and silicon carbide, although other materials may be possible as well. By way of another example, the cap 204f may include, or may consist of, at least one material selected from a group of materials. The group of materials may include: silicon, an oxide (e.g. silicon oxide), a nitride (e.g. silicon nitride), a polyimide, a metal (e.g. copper), a metal alloy (e.g. an alloy including copper), and a metal stack, although other materials may be possible as well.

As described above, the MEMS device 204 may be at least partially embedded in the mold compound 202. As used herein "at least partially embedded" may mean that the mold compound 202 may enclose (e.g. cover) the MEMS device 204 from at least one sidewall 204c (e.g. from all sidewalls 204c) and the second side 204b. "At least partially embedded" may also mean that the mold compound 202 may cover the MEMS device 204 from all sides (irrespective of whether the cap 204f is present or not). In other words, "at least partially embedded" may mean that the mold compound 202 may enclose (e.g. cover) the MEMS device 204 from at least one sidewall 204c (e.g. from all sidewalls 204c), the first side 204a (e.g. active side), and the second side 204b. Stated in yet another way, "at least partially embedded" may mean that the mold compound 202 may enclose (e.g. fully enclose, e.g. fully cover) the MEMS device 204 from all sides.

The mold compound 202 may include, or may consist of, at least one polymer. The mold compound 202 may include, or may consist of, a plastic material. The plastic material of the mold compound 202 may include, or may consist of, a thermosetting molding compound (e.g. a resin, e.g. an epoxy resin). By way of another example, the plastic material of the mold compound 202 may include, or may consist of, a thermoplastic (e.g. a high purity fluoropolymer). The mold compound 202 may include a filler material (e.g. including, or consisting of, at least one of a silica filler, a glass filler, a glass cloth, rubber, polymer and metal particles). A filler rate of the mold compound 202, which may refer to a percentage of total volume of the mold compound 202 occupied by the filler material, may be greater than or equal to about 80%, for example in the range from about 80% to about 90%. In another example, the filler rate of the mold compound 202 may be greater than or equal to about 90%. The mold compound 202, in contrast to the substrate 102 shown in FIG. 1A and FIG. 1B, may be free from laminate material and may, for example, be formed by means of a molding process (e.g. compression mold flow process and/or a mold sheet pressing process), instead of a lamination process. For example, the mold compound 202 may be formed from a liquid mold compound (namely, a mold compound in a liquid state) by means of a compression mold flow process. By way of another example, the mold compound 202 may be formed from a mold sheet (namely, a mold compound in a form of a sheet, e.g. a rigid sheet) by means of a mold sheet pressing process.

The chip arrangement 200 shown in FIG. 2 may, for example, be configured as a chip package. In other words, the MEMS device 204 may be packaged within the mold compound 202. The chip arrangement 200 shown in FIG. 2 may, for example, be configured as an embedded wafer level ball grid array (eWLB) package. In other words, the MEMS device 204 may be packaged within the mold compound 202 using an eWLB process flow.

The MEMS device 204, which may be at least partially embedded within the mold compound 202, may be provided with an interface through which signals (e.g. electrical signals, power supply potentials, ground potentials, etc.) may be exchanged with MEMS device 204. A chip arrangement including such an interface is shown in FIG. 3.

Figure 3:
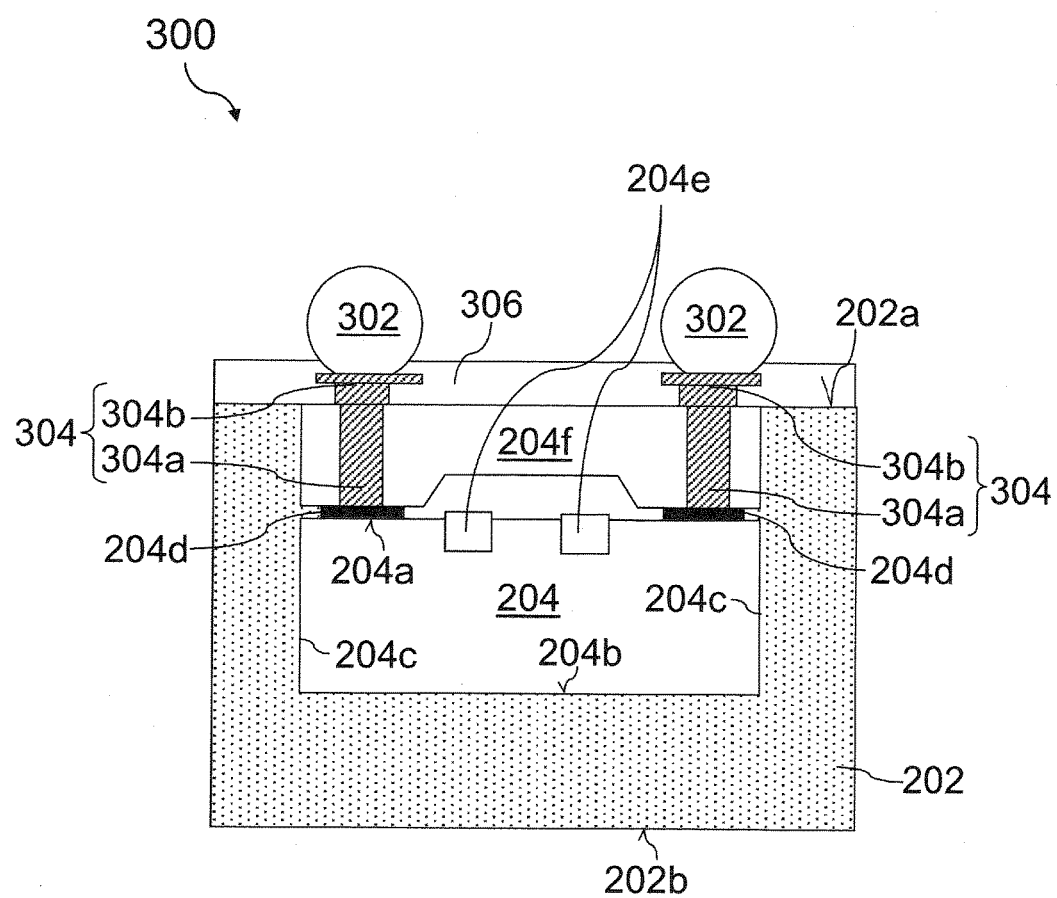
FIG. 3 shows a chip arrangement including a mold compound, a MEMS device at least partially embedded in the mold compound, at least one electrical connector, and an interconnect structure configured to electrically couple the MEMS device to the at least one electrical connector.

FIG. 3 shows a chip arrangement 300 including the mold compound 202, the MEMS device 204 at least partially embedded in the mold compound 202, at least one electrical connector 302, and an interconnect structure 304 configured to electrically couple the MEMS device 204 to the at least one electrical connector 302.

Reference signs in FIG. 3 that are the same as in FIG. 2 denote the same or similar elements as in FIG. 2. Thus, those elements will not be described in detail again here; reference is made to the description above. Differences between FIG. 3 and FIG. 2 are described below.

The mold compound 202 may have a first side 202a and a second side 202b opposite the first side 202a. The first side 202a of the mold compound 202 may, for example, be a frontside of the chip arrangement 300. The second side 202b of the mold compound 202 may, for example, be a backside of the chip arrangement 300.

In the chip arrangement 300 shown in FIG. 3, the first side 204a (e.g. active side) of the MEMS device 204 may face in a direction identical to a direction to which the first side 202a of the mold compound 202 may face. In another example, the first side 204a (e.g. active side) of the MEMS device 204 may face in a direction opposite to a direction to which the first side 202a of the mold compound 202 may face.

The chip arrangement 300 may include at least one electrical connector 302 disposed at (e.g. disposed on or over) the first side 202b of the mold compound 202. The at least one electrical connector 302 may include, or may consist of, at least one electrically conductive material selected from a group of electrically conductive materials. The group of electrically conductive materials may consist of: a metal or metal alloy. For example, the at least one electrical connector 302 may consist of a solder material (e.g. an alloy of tin, silver, and copper). By way of another example, the at least one electrical connector 302 may consist of copper, palladium, titanium, tungsten, nickel, gold, aluminum, or a conductive paste, or a stack or an alloy containing at least one of the listed metals.

The at least one electrical connector 302 may include, or may be, at least one of a ball (e.g. a solder ball), a bump (e.g. a solder ball), and a pillar (e.g. a copper pillar). The at least one electrical connector 302 may include, or may be, a ball grid array (BGA) of solder balls. The at least one electrical connector 302 may provide an interface for the chip arrangement 300. In other words, signals (e.g. electrical signals, power supply potentials, ground potentials, etc.) may be exchanged with MEMS device 204 via the at least one electrical connector 302 (e.g. BGA of solder balls).

The chip arrangement 300 may include an interconnect structure 304, which may be configured to electrically coupled the MEMS device 204 to the at least one electrical connector 302. The interconnect structure 304 may, for example, redistribute and/or re-map electrical connections from the MEMS device 204 (e.g. from the first side 204a of the MEMS device 204) to the at least one electrical connector 302 (e.g. BGA of solder balls). Accordingly, signals (e.g. electrical signals, power supply potentials, ground potentials, etc.) may be exchanged with MEMS device 204 via the at least one electrical connector 302 (e.g. BGA of solder balls) and the interconnect structure 304.

The interconnect structure 304 may, for example, include, or may consist of, at least one electrically conductive material, e.g. at least one metal and/or metal alloy. The at least one electrically conductive material may be selected from a group of electrically conductive materials. The group of electrical conductive materials may consist of: aluminum, tungsten, titanium, copper, nickel, palladium and gold or a conductive paste (polymer, filled with electrically conductive particles), although other electrically conductive materials may be possible as well.

The interconnect structure 304 may include at least one through-via 304a, which may extend through at least a part of the MEMS device 204. For example, in the chip arrangement 300 shown in FIG. 3, the at least one through-via 304a of the interconnect structure 304 may extend through at least a part of the cap 204f of the MEMS device 204. In another example, the at least one through-via 304a of the interconnect structure 304 may extend through at least a part of a body of the MEMS device 204 (namely, a part of the MEMS device 204 other than the cap 204θ. The at least one through-via 304a of the interconnect structure 304 may be electrically coupled to the at least one electrically conductive contact 204d of the MEMS device 204, as shown in FIG. 3.

In the chip arrangement 300 shown in FIG. 3, the mold compound 202 may enclose the MEMS device 204 from at least one sidewall 204c (e.g. from all sidewalls 204c) and the second side 204b. In another example (e.g. in which the mold compound 202 may cover the cap 204f of the MEMS device 204 from all sides), the mold compound 202 may enclose the MEMS device 204 from at least one sidewall 204c (e.g. from all sidewalls 204c), the first side 204a (e.g. active side), and the second side 204b. In such an example, the at least one through-via 304a of the interconnect structure 304 may extend through at least a part of the mold compound 202 (e.g. to the first side 202a of the mold compound 202), for example, through the part of the mold compound 202 enclosing the MEMS device 204 from the first side 204a (e.g. active side) of the MEMS device 204.

As shown in FIG. 3, the interconnect structure 304 may include a redistribution structure 304b disposed at (e.g. disposed on or over) the first side 202a of the mold compound 202. The redistribution structure 304b may include, or may be, a redistribution layer (RDL). As described above, the first side 202a of the mold compound 202 may, for example, be the frontside of the chip arrangement 300. Accordingly, the redistribution structure 304b of the interconnect structure 304 disposed at (e.g. disposed on or over) the first side 202a of the mold compound 202 may include, or may be, a frontside RDL. The redistribution structure 304b of the interconnect structure 304 (e.g. frontside RDL) may be partially or fully disposed within an insulating layer 306 disposed at (e.g. disposed on or over) the first side 202a of the mold compound 202. The insulating layer 306 may include, or may be, at least one of a dielectric layer and a solder stop layer.

The redistribution structure 304b (e.g. RDL) of the interconnect structure 304 may include, or may be, a single-level (e.g. a single layer) RDL. For example, the redistribution structure 304b may include, or may be, a single-level RDL that may include a single metal layer disposed within the insulating layer 306, which may include, or may consist of, one, two or more dielectric layers. The redistribution structure 304b (e.g. RDL) of the interconnect structure 304 may include, or may be, a multi-level (e.g. a multi-layer) RDL. For example, the redistribution structure 304b may include, or may be, a multi-level RDL that may include at least two metal layers disposed within the insulating layer 306, which may include, or may consist of, three or more dielectric layers.

The chip arrangement 300 shown in FIG. 3 may, for example, be configured as a chip package. In other words, the MEMS device 204 may be packaged within the mold compound 202, and may be provided with an interface to the MEMS device 204. The interface to the MEMS device 204 may include, or may be, the at least one electrical connector 302 (e.g. BGA of solder balls) and the interconnect structure 304 (e.g. at least one through-via 304a and/or redistribution structure 304b).

The chip arrangement 300 shown in FIG. 3 may, for example, be configured as an embedded wafer level ball grid array (eWLB) package. In other words, the MEMS device 204 may be embedded in the mold compound 202, and may be provided with the at least one electrical connector 302 (e.g. BGA of solder balls) and the interconnect structure 304 (e.g. at least one through-via 304a and/or redistribution structure 304b) by means of an eWLB process flow.

As shown in FIG. 3, a distance between the MEMS device 204 (e.g. the first side 204a of the MEMS device 204) and the at least one electrical connector 302 (e.g. BGA of solder balls) may be small. Accordingly, a length of the interconnect structure 304 configured to electrically coupled the MEMS device 204 to the at least one electrical connector 302 may be short. Consequently, an effect provided by the chip arrangement 300 may be reliable electrical performance (e.g. lower resistance and/or capacity and/or inductivity) of an interconnect to the MEMS device 204.

As shown in FIG. 3, the interconnect structure 304 configured to electrically coupled the MEMS device 204 to the at least one electrical connector 302 may include a redistribution structure 304b (e.g. RDL), which may have more reliable electrical performance (e.g. lower resistance and/or capacity and/or inductivity) compared to the wire bonding 112a, 112b, 112c shown in FIG. 1A and FIG. 1B. Consequently, an effect provided by the chip arrangement 300 may be reliable electrical performance (e.g. lower resistance and/or capacity and/or inductivity) of an interconnect to the MEMS device 204.

As shown in FIG. 3, the interconnect structure 304 configured to electrically coupled the MEMS device 204 to the at least one electrical connector 302 may include at least one through-via 304a and/or a redistribution structure 304b (e.g. RDL) that may, for example, be confined within a lateral extent of the MEMS device 204. Consequently, an effect provided by the chip arrangement 300 may be a chip arrangement having a small lateral extent (e.g. a small footprint).

A height of the mold compound 202 may be grinded down to a thickness that may be substantially equal to a thickness of the MEMS device 204. Consequently, an effect provided by the chip arrangement 300 may be a chip arrangement including a packaged MEMS device 204 that may have a small height and/or thickness.

As described above, the chip arrangement 300 may be configured as an eWLB package. Consequently, an effect provided by the chip arrangement 300 may be a chip arrangement including a packaged MEMS device 204 that may be manufactured in a short time duration.

As described above, a MEMS device may be used with a semiconductor chip. For example, an operation of the MEMS device may be controlled by means of the semiconductor chip. By means of another example, data (e.g. measurements) from the MEMS device may be provided to the semiconductor chip. Therefore, the MEMS device 204 shown in FIG. 2 and FIG. 3 may be packaged with at least one semiconductor chip. Such a chip arrangement is shown in FIG. 4.

Figure 4:
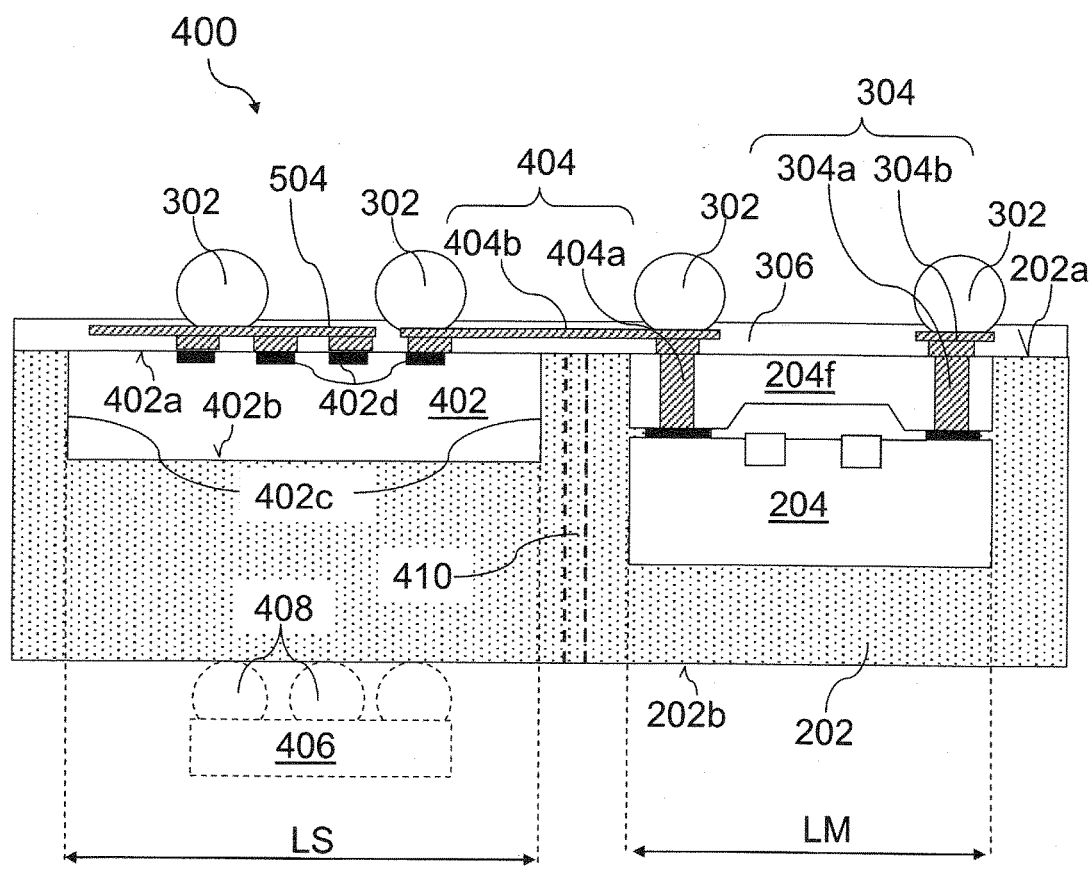
FIG. 4 shows a chip arrangement including a mold compound, a MEMS device and at least one semiconductor chip at least partially embedded in the mold compound, where the MEMS device and the at least one semiconductor chip are disposed laterally adjacent to each other.

FIG. 4 shows a chip arrangement 400 including the mold compound 202, the MEMS device 204 and at least one semiconductor chip 402 at least partially embedded in the mold compound 202, where the MEMS device 204 and the at least one semiconductor chip 402 are disposed laterally adjacent to each other.

Reference signs in FIG. 4 that are the same as in FIG. 3 denote the same or similar elements as in FIG. 3. Thus, those elements will not be described in detail again here; reference is made to the description above. The various effects described above in relation to the chip arrangement 300 shown in FIG. 3 may be analogously valid for the chip arrangement 400 shown in FIG. 4. Differences between FIG. 4 and FIG. 3 are described below.

Only one semiconductor chip 402 is shown as an example, however the number of semiconductor chips 402 that may be at least partially embedded in the mold compound 202 may be greater than one, and may, for example, be two, three, four, five, etc.

The at least one semiconductor chip 402 may include, or may be, at least one of a logic chip, an application-specific integrated circuit (ASIC), a memory chip, an active device (e.g. a transistor), and a passive device (e.g. a resistor and/or capacitor and/or inductor). For example, the at least one semiconductor chip 402 may include, or may be, a chip including one or more logic circuitry and/or one or more passive devices. As described above in relation to FIG. 3, the number of MEMS devices 204 may be greater than one, and may, for example, be two, three, four, five, etc. Accordingly, in another example, the chip arrangement 400 may include two or more MEMS devices 204 (e.g. two or more sensors) arranged with one or more semiconductor chips 402 (e.g. having one or more logic circuitry and/or one or more passive devices).

The at least one semiconductor chip 402 may include a semiconductor substrate, which may include, or may consist of, a semiconductor material. The semiconductor material may include, or may be, at least one material selected from a group of materials, the group consisting of: silicon, germanium, gallium nitride, gallium arsenide, and silicon carbide, although other materials may be possible as well.

The at least one semiconductor chip 402 may have a first side 402a and a second side 402b opposite the first side 402a. The at least one semiconductor chip 402 may further include at least one sidewall 402c. The first side 402a and the second side 402b of the at least one semiconductor chip 402 may include, or may be, a frontside and a backside of the at least one semiconductor chip 402, respectively. By way of another example, the first side 402a of the at least one semiconductor chip 402 may include, or may be, an active side of the at least one semiconductor chip 402. By way of yet another example, the first side 402a and the second side 402b of the at least one semiconductor chip 402 may include, or may be, a bottom surface and a top surface of the at least one semiconductor chip 402, respectively.

The at least one semiconductor chip 402 may include at least one electrically conductive contact 402d, which may be disposed at the first side 402a of the at least one semiconductor chip 402. The at least one electrically conductive contact 402d of the at least one semiconductor chip 402 may include, or may be, a pad (e.g. a bonding and/or contact pad). The at least one electrically conductive contact 402d of the at least one semiconductor chip 402 may provide an interface (e.g. an electrical interface) for the at least one semiconductor chip 402. In other words, signals (e.g. electrical signals, power supply potentials, ground potentials, etc.) may be exchanged with the at least one semiconductor chip 402 via the at least one electrically conductive contact 402d.

The at least one semiconductor chip 402 may be disposed laterally adjacent to the MEMS device 204, as shown in FIG. 4. In the example shown in FIG. 4, a lateral extent LM of the MEMS device 204 may be less than or equal to a lateral extent LS of the at least one semiconductor chip 402. In another example, the lateral extent LM of the MEMS device 204 may be greater than the lateral extent LS of the at least one semiconductor chip 402.

The chip arrangement 400 may include a second interconnect structure 404, which may be configured to electrically couple the MEMS device 204 to the at least one semiconductor chip 402.

The second interconnect structure 404 may, for example, include, or may consist of, at least one electrically conductive material, e.g. at least one metal and/or metal alloy. The at least one electrically conductive material may be selected from a group of electrically conductive materials. The group of electrical conductive materials may consist of: aluminum, tungsten, titanium, copper, nickel, palladium and gold, or a conductive paste (polymer, filled with electrically conductive particles), or a stack or an alloy containing at least one of the listed metals, although other electrically conductive materials may be possible as well.

The second interconnect structure 404 may include at least one through-via 404a, which may extend through at least a part of the MEMS device 204. For example, the at least one through-via 404a of the second interconnect structure 404 may extend through at least a part of the cap 204f of the MEMS device 204. In another example, the at least one through-via 404a of the second interconnect structure 404 may extend through at least a part of a body of the MEMS device 204 (namely, a part of the MEMS device 204 other than the cap 204f). The at least one through-via 404a of the second interconnect structure 404 may be electrically coupled to the at least one electrically conductive contact 204d of the MEMS device 204.

In the chip arrangement 400 shown in FIG. 4, the mold compound 202 may enclose the MEMS device 204 from at least one sidewall 204c (e.g. from all sidewalls 204c) and the second side 204b. In another example (e.g. in which the mold compound 202 may cover the cap 204f of the MEMS device 204 from all sides), the mold compound 202 may enclose the MEMS device 204 from at least one sidewall 204c (e.g. from all sidewalls 204c), the first side 204a (e.g. active side), and the second side 204b. In such an example, the at least one through-via 404a of the second interconnect structure 404 may extend through at least a part of the mold compound 202 (e.g. to the first side 202a of the mold compound 202), for example, through the part of the mold compound 202 enclosing the MEMS device 204 from the first side 204a (e.g. active side) of the MEMS device 204.

As shown in FIG. 4, the second interconnect structure 404 may include a redistribution structure 404b disposed at (e.g. disposed on or over) the first side 202a of the mold compound 202. The redistribution structure 404b may include, or may be, a redistribution layer (RDL). As described above, the first side 202a of the mold compound 202 may, for example, be the frontside of the chip arrangement 400. Accordingly, the redistribution structure 404b of the second interconnect structure 404 disposed at (e.g. disposed on or over) the first side 202a of the mold compound 202 may include, or may be, a frontside RDL. The redistribution structure 404b of the second interconnect structure 404 (e.g. frontside RDL) may be partially or fully disposed within the insulating layer 306. The redistribution structure 404b (e.g. RDL) of the second interconnect structure 404 may include, or may be, a single-level (e.g. a single layer) RDL or a multi-level (e.g. a multi-layer) RDL.

As shown in FIG. 4, the second interconnect structure 404 (e.g. the redistribution structure 404b of the second interconnect structure 404) may be electrically coupled to the at least one electrically conductive contact 402d of the at least one semiconductor chip 402. In the chip arrangement 400 shown in FIG. 4, the mold compound 202 may enclose the at least one semiconductor chip 402 from at least one sidewall 402c (e.g. from all sidewalls 402c) and the second side 402b. In another example (e.g. in which the mold compound 202 may cover the at least one semiconductor chip 402 from all sides), the mold compound 202 may enclose the at least one semiconductor chip 402 from at least one sidewall 402c (e.g. from all sidewalls 402c), the first side 402a, and the second side 402b. In such an example, the second interconnect structure 404 may extend through at least a part of the mold compound 202, for example, to the at least one electrically conductive contact 402d of the at least one semiconductor chip 402 through the part of the mold compound 202 enclosing the at least one semiconductor chip 402 from its first side 402a.

The chip arrangement 400 may include a third interconnect structure 504, which may be configured to electrically couple the at least one semiconductor chip 402 to the at least one electrical connector 302.

The third interconnect structure 504 may, for example, include, or may consist of, at least one electrically conductive material, e.g. at least one metal and/or metal alloy. The at least one electrically conductive material may be selected from a group of electrically conductive materials. The group of electrical conductive materials may consist of: aluminum, tungsten, titanium, copper, nickel, palladium and gold, or a conductive paste (polymer, filled with electrically conductive particles), or a stack or an alloy containing at least one of the listed metals, although other electrically conductive materials may be possible as well.

The third interconnect structure 504 may include a redistribution structure disposed at (e.g. disposed on or over) the first side 202a of the mold compound 202. The redistribution structure may include, or may be, a redistribution layer (RDL). As described above, the first side 202a of the mold compound 202 may, for example, be the frontside of the chip arrangement 400. Accordingly, the third interconnect structure 504 (e.g. the redistribution structure) disposed at (e.g. disposed on or over) the first side 202a of the mold compound 202 may include, or may be, a frontside RDL. The third interconnect structure 504 (e.g. RDL, e.g. frontside RDL) may be partially or fully disposed within the insulating layer 306. The third interconnect structure 504 (e.g. RDL, e.g. frontside RDL) may include, or may be, a single-level (e.g. a single layer) RDL or a multi-level (e.g. a multi-layer) RDL.

As shown in FIG. 4, the third interconnect structure 504 (e.g. the redistribution structure) may be electrically coupled to the at least one electrically conductive contact 402d of the at least one semiconductor chip 402. In the chip arrangement 400 shown in FIG. 4, the mold compound 202 may enclose the at least one semiconductor chip 402 from at least one sidewall 402c (e.g. from all sidewalls 402c) and the second side 402b. In another example (e.g. in which the mold compound 202 may cover the at least one semiconductor chip 402 from all sides), the mold compound 202 may enclose the at least one semiconductor chip 402 from at least one sidewall 402c (e.g. from all sidewalls 402c), the first side 402a, and the second side 402b. In such an example, at least a part of the third interconnect structure 504 may extend through at least a part of the mold compound 202, for example, to the at least one electrically conductive contact 402d of the at least one semiconductor chip 402 through the part of the mold compound 202 enclosing the at least one semiconductor chip 402 from its first side 402a.

In the chip arrangement 400 shown in FIG. 4, the MEMS device 204 may be electrically coupled to the at least one electrical connector 302 (e.g. via the interconnect structure 304) and to the at least one semiconductor chip 402 (e.g. via the second interconnect structure 404). However, in another example, the MEMS device 204 may be electrically coupled to the at least one electrical connector 302 (e.g. via the interconnect structure 304) only. In such an example, there may not be an electrical connection between the MEMS device 204 and the at least one semiconductor chip 402 via the second interconnect structure 404. In yet another example, the MEMS device 204 may be electrically coupled to at least one semiconductor chip 402 (e.g. via the second interconnect structure 404) only. In such an example, there may not be an electrical connection between the MEMS device 204 and the at least one electrical connector 302 via the interconnect structure 404. Instead, an electrical connection between the MEMS device 204 and the at least one electrical connector 302 may be via the at least one semiconductor chip 402, and may, for example, be mediated by the second interconnect structure 404. In summary, the MEMS device 204 may be electrically coupled to the at least one electrical connector 302 (e.g. via the interconnect structure 304) or to the at least one semiconductor chip 402 (e.g. via the second interconnect structure 404), or to both.

The chip arrangement 400 shown in FIG. 4 may include a least one second semiconductor chip 406, which may be disposed over the second side 202b of the mold compound 202. Only one second semiconductor chip 406 is shown as an example, however the number of second semiconductor chips 406 may be greater than one, and may, for example, be two, three, four, five, etc. For example, the chip arrangement 400 may include a plurality of second semiconductor chips 406, which may, for example, be arranged laterally adjacent to each other (for example, see description below in respect of FIG. 5).

The at least one second semiconductor chip 406 may be configured as a chip package. In such an example, the chip arrangement 400 may be configured as a package-on-package (PoP). The at least one second semiconductor chip 406 may be electrically coupled to at least one of the MEMS device 204, the at least one electrical connector 302, and the at least one semiconductor chip 402. The electrical coupling may be mediated by means of at least one electrically conductive interconnect 408 and/or at least one through-via 410.

The at least one electrically conductive interconnect 408 may include, or may be, a redistribution structure, a bump structure, a pillar structure (e.g. a copper pillar structure), and a metallization (e.g. a bump metallization, e.g. an under-bump metallization), although other intervening structures between the at least one second semiconductor chip 406 and the mold compound 202 may be possible as well. The at least one through-via 410 may extend through at least a part of the mold compound 202 (e.g. from the second side 202b of the mold compound 202 to the first side 202a of the mold compound 202).

As shown in FIG. 4, a distance between the MEMS device 204 (e.g. the first side 204a of the MEMS device 204) and the at least one semiconductor chip 402 (e.g. first side 402a of the at least one semiconductor chip 402) may be small. Accordingly, a length of the second interconnect structure 404 configured to electrically coupled the MEMS device 204 to the at least one semiconductor chip 402 may be short. Consequently, an effect (e.g. additional effect) provided by the chip arrangement 400 may be reliable electrical performance (e.g. lower resistance and/or capacity and/or inductivity) of an interconnect between the MEMS device 204 and the at least one semiconductor chip 402.

As shown in FIG. 4, the second interconnect structure 404 configured to electrically coupled the MEMS device 204 to the at least one semiconductor chip 402 may include a redistribution structure 404b (e.g. RDL), which may have more reliable electrical performance (e.g. lower resistance and/or capacity and/or inductivity) compared to the wire bonding 112a, 112b, 112c shown in FIG. 1A and FIG. 1B. Consequently, an effect (e.g. additional effect) provided by the chip arrangement 400 may be reliable electrical performance (e.g. lower resistance and/or capacity and/or inductivity) of an interconnect between the MEMS device 204 and the at least one semiconductor chip 402.

As shown in FIG. 4, the MEMS device 204 and/or the at least one semiconductor chip 402 may be contacted (e.g. by means of the interconnect structure 304 and/or the second interconnect structure 404) from the first side 202a and/or the second side 202b of the mold compound 202, for example, in case the mold compound 202 is grinded down to a suitable thickness, e.g. a thickness that may be substantially equal to a thickness of the MEMS device 204 or to a thickness of the at least one semiconductor chip 402. Consequently, an effect (e.g. additional effect) provided by the chip arrangement 300 may be a chip arrangement having a small lateral extent (e.g. a small footprint) and/or a small height and/or thickness.

Figure 5:
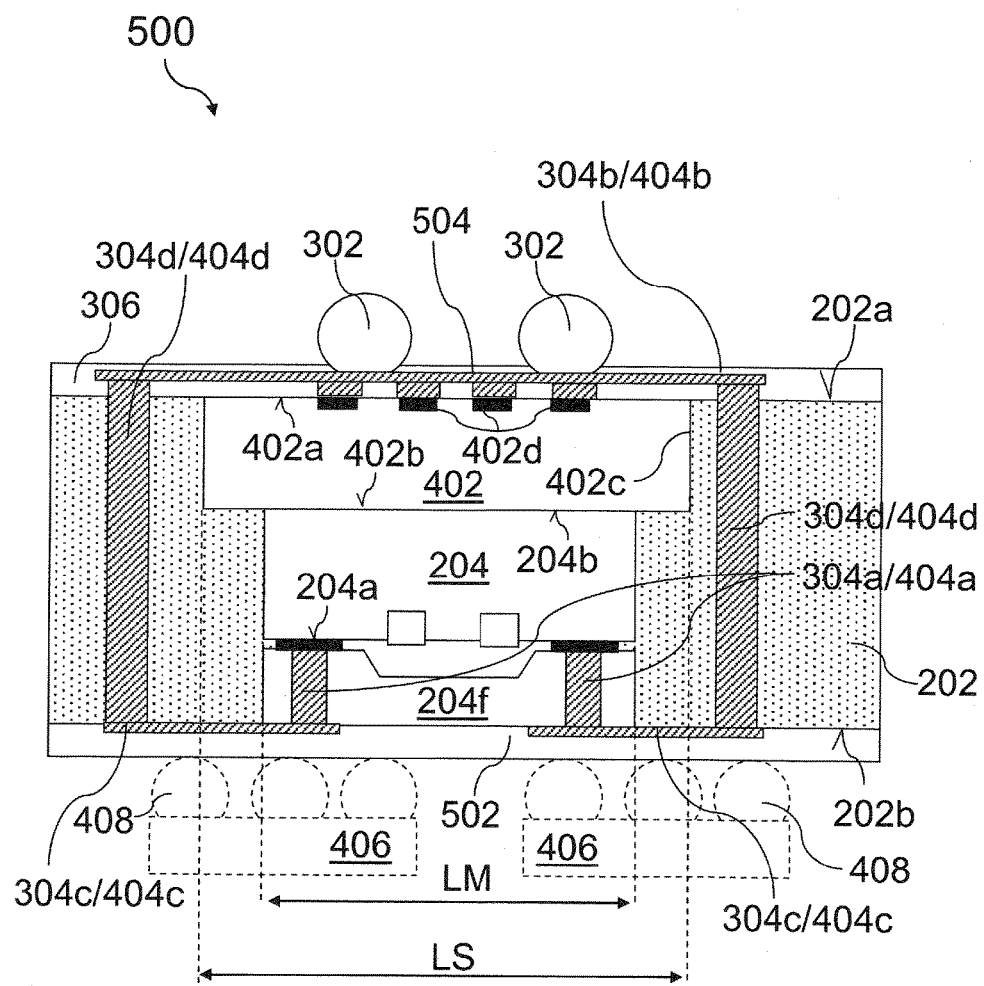
FIG. 5 and FIG. 6 show chip arrangements including a mold compound, a MEMS device and at least one semiconductor chip at least partially embedded in the mold compound, where the MEMS device and the at least one semiconductor chip are arranged as a die stack.

FIG. 5 shows a chip arrangement 500 including the mold compound 202, the MEMS device 204 and the at least one semiconductor chip 402 at least partially embedded in the mold compound 202, where the MEMS device 204 and the at least one semiconductor chip 402 are arranged as a die stack.

Reference signs in FIG. 5 that are the same as in FIG. 4 denote the same or similar elements as in FIG. 4. Thus, those elements will not be described in detail again here; reference is made to the description above. The various effects described above in relation to the chip arrangement 400 shown in FIG. 4 may be analogously valid for the chip arrangement 500 shown in FIG. 5. Differences between FIG. 5 and FIG. 4 are described below.

As shown in FIG. 5, the MEMS device 204 and the at least one semiconductor chip 402 may be arranged as a die stack. In other words, the MEMS device 204 may be disposed over (e.g. stacked and/or mounted over) the at least one semiconductor chip 402. In such an example, the at least one semiconductor chip 402 may be used to cap the MEMS device 204.

As described above, the lateral extent LM of the MEMS device 204 may be less than or equal to the lateral extent LS of the at least one semiconductor chip 402. In such an example, the MEMS device 204 may be disposed laterally within a boundary of the at least one semiconductor chip 402, as shown in FIG. 5. For example, the lateral extent LM of the MEMS device 204 may be within the lateral extent LS of the at least one semiconductor chip 402. In other words, the at least one semiconductor chip 402 (e.g. a boundary of the at least one semiconductor chip 402) may extend laterally beyond the MEMS device 204 (e.g. a boundary of the MEMS device 204).

In an example where the lateral extent LM of the MEMS device 204 may be less than the lateral extent LS of the at least one semiconductor chip 402, a plurality of MEMS devices 204 may be arranged laterally adjacent to each other and disposed over (e.g. stacked and/or mounted over) the at least one semiconductor chip 402 (not shown in FIG. 5). In this example, the at least one semiconductor chip 402 may be used with the plurality of MEMS devices 204, for example, to control the functionality of the plurality of MEMS devices 204.

As described above, the interconnect structure 304 may be configured to electrically coupled the MEMS device 204 to the at least one electrical connector 302, and the second interconnect structure 404 may be configured to electrically couple the MEMS device 204 to the at least one semiconductor chip 402.

In the chip arrangement 500 shown in FIG. 5, the first side 204a of the MEMS device 204 may be facing in a direction identical to a direction to which the second side 202b of the mold compound 202 faces. Accordingly, the interconnect structure 304 may include a redistribution structure 304c, which may be disposed at (e.g. disposed on or over) the second side 202b of the mold compound 202. In like manner, the second interconnect structure 404 may include a redistribution structure 404c, which may be disposed at (e.g. disposed on or over) the second side 202b of the mold compound 202. The redistribution structures 304c and/or 404c (indicated as "304c/404c" in FIG. 5) disposed at (e.g. disposed on or over) the second side 202b of the mold compound 202 shown in FIG. 4 may be in addition to, or instead of, the redistribution structures 304b and/or 404b (indicated as "304b/404b" in FIG. 5) disposed at (e.g. disposed on or over) the first side 202a of the mold compound 202 shown in FIG. 4.

The redistribution structures 304c and/or 404c may include, or may be, a redistribution layer (RDL). As described above, the second side 202b of the mold compound 202 may, for example, be the backside of the chip arrangement 500. Accordingly, the redistribution structures 304c and/or 404c may include, or may be, a backside RDL. The redistribution structure 304c and/or 404c may be partially or fully disposed within an insulating layer 502 disposed at (e.g. disposed on or over) the second side 202b of the mold compound 202. The insulating layer 502 may include, or may be, at least one of a dielectric layer and a solder stop layer.

The interconnect structure 304 may include at least one through-via 304d that may extend through at least a part of the mold compound 202. In like manner, the second interconnect structure 404 may include at least one through-via 404d that may extend through at least a part of the mold compound 202. For example, the chip arrangement 500 shown in FIG. 5 may include the at least one through-vias 304d and/or 404d (indicated as "304d/404d" in FIG. 5) that may extend from the first side 202a of the mold compound 202 to the second side 202b of the mold compound 202. The at least one through-vias 304d and/or 404d may be disposed laterally adjacent to the MEMS device 204, as shown in FIG. 5.

The chip arrangement 500 shown in FIG. 5 may include a plurality of second semiconductor chips 406 (e.g. dies and/or packages), which may be disposed over the second side 202b of the mold compound 202, and arranged laterally adjacent to each other. The plurality of second semiconductor chips 406 may be electrically coupled to at least one of the MEMS device 204, the at least one electrical connector 302, and the at least one semiconductor chip 402, for example, by means of at least one electrically conductive interconnect 408.

As shown in FIG. 5, a lateral extent (e.g. footprint) of the chip arrangement 500 may be reduced by means of stacking the MEMS device 204 over the at least one semiconductor chip 402. In an example where a plurality of MEMS devices 204 may be stacked over the at least one semiconductor chip 402, the reduction in the lateral extent (e.g. footprint) may be more pronounced. Consequently, an effect (e.g. additional effect) provided by the chip arrangement 500 may be a chip arrangement having a small lateral extent (e.g. a small footprint).

Figure 6:
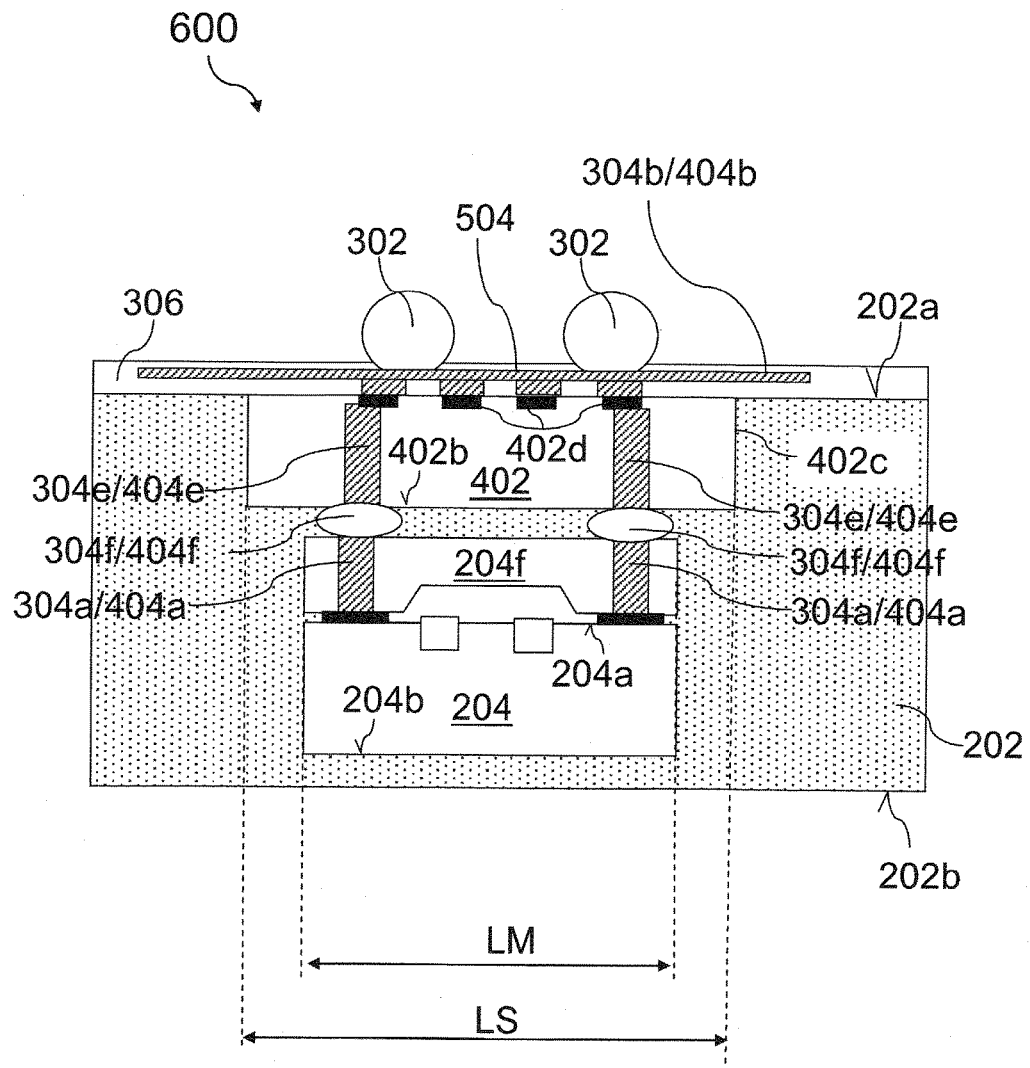

FIG. 6 shows a chip arrangement 600 including the mold compound 202, the MEMS device 204 and at least one semiconductor chip 402 at least partially embedded in the mold compound 202, where the MEMS device 204 and the at least one semiconductor chip 402 are arranged as a die stack.

Reference signs in FIG. 6 that are the same as in FIG. 5 denote the same or similar elements as in FIG. 5. Thus, those elements will not be described in detail again here; reference is made to the description above. The various effects described above in relation to the chip arrangement 500 shown in FIG. 5 may be analogously valid for the chip arrangement 600 shown in FIG. 6. Differences between FIG. 6 and FIG. 5 are described below.

In contrast to the chip arrangement 500 shown in FIG. 5, the first side 204a (e.g. active side) of the MEMS device 204 shown in FIG. 6 may face in a direction identical to a direction to which the first side 202a of the mold compound 202 faces. In such an example, the interconnect structure 304 configured to electrically couple the MEMS device 204 to the at least one electrical connector 302 may include at least one through-via 304e that may extend through at least a part of the at least one semiconductor chip 402. In like manner, the second interconnect structure 404 configured to electrically couple the MEMS device 204 to the at least one semiconductor chip 402 may include at least one through-via 404e that may extend through at least a part of the at least one semiconductor chip 402. The at least one through-vias 304e and/or 404e are indicated as "304e/404e" in FIG. 6.

The interconnect structure 304 may further include at least one conductive interconnect 304f disposed between the at least one semiconductor chip 402 and the MEMS device 204. In like manner, the second interconnect structure 404 may further include at least one conductive interconnect 404f disposed between the at least one semiconductor chip 402 and the MEMS device 204.

The at least one conductive interconnects 304f and/or 404f (indicated as "304f/404f" in FIG. 6) may include, or may be, a redistribution structure, a bump structure, a pillar structure (e.g. a copper pillar structure), and a metallization (e.g. a bump metallization, e.g. an under-bump metallization, although other intervening structures between the at least one semiconductor chip 402 and the MEMS device 204 may be possible as well.

Figure 7:
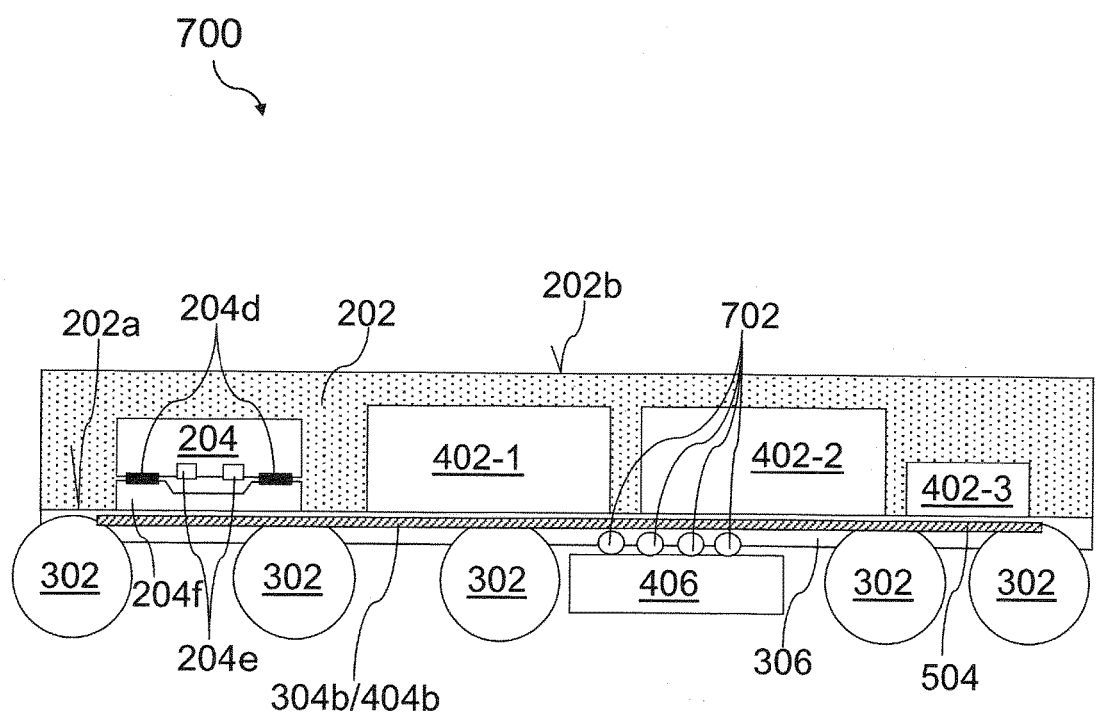
FIG. 7 shows a chip arrangement including a MEMS device and a plurality of semiconductor chips at least partially embedded in the mold compound, and at least one second semiconductor chip disposed at a first side of the mold compound.

FIG. 7 shows a chip arrangement 700 including the MEMS device 204 and a plurality of semiconductor chips 402-1, 402-2, 402-3 at least partially embedded in the mold compound 202, and at least one second semiconductor chip 406 disposed at the first side 202a of the mold compound 202.

Reference signs in FIG. 7 that are the same as in FIG. 4 denote the same or similar elements as in FIG. 4. Thus, those elements will not be described in detail again here; reference is made to the description above. The various effects described above in relation to the chip arrangement 400 shown in FIG. 4 may be analogously valid for the chip arrangement 700 shown in FIG. 7. Differences between FIG. 7 and FIG. 4 are described below.

As shown in FIG. 7, the chip arrangement 700 may include a plurality of semiconductor chips 402-1, 402-2, 402-3 at least partially embedded in the mold compound 202. The at least one second semiconductor chip 406 may be disposed at the first side 202a of the mold compound 202, and may be configured as a daughter die. The at least one second semiconductor chip 406 (e.g. daughter die) may have an active side that may face an active side of a semiconductor chip of the plurality of semiconductor chips 402-1, 402-2, 402-3. In other words, the at least one second semiconductor chip 406 (e.g. daughter die) and the plurality of semiconductor chips 402-1, 402-2, 402-3 may be arranged in a face-to-face configuration. The at least one second semiconductor chip 406 (e.g. daughter die) may be electrically coupled (e.g. via at least one electrically conductive interconnect 702) to at least one of the MEMS device 204, the plurality of semiconductor chips 402-1, 402-2, 402-3, and the at least one electrical connector 302. In another example, at least one other second semiconductor chip 406 may be disposed at the second side 202b of the mold compound 202 (not shown in FIG. 7).

The at least one electrically conductive interconnect 702 may include, or may be, at least one of a redistribution structure, a bump structure, a pillar structure (e.g. a copper pillar structure), and a metallization (e.g. a bump metallization, e.g. an under-bump metallization), although other intervening structures between the at least one second semiconductor chip 406 (e.g. daughter die) and the mold compound 202 may be possible as well.

Figure 8:
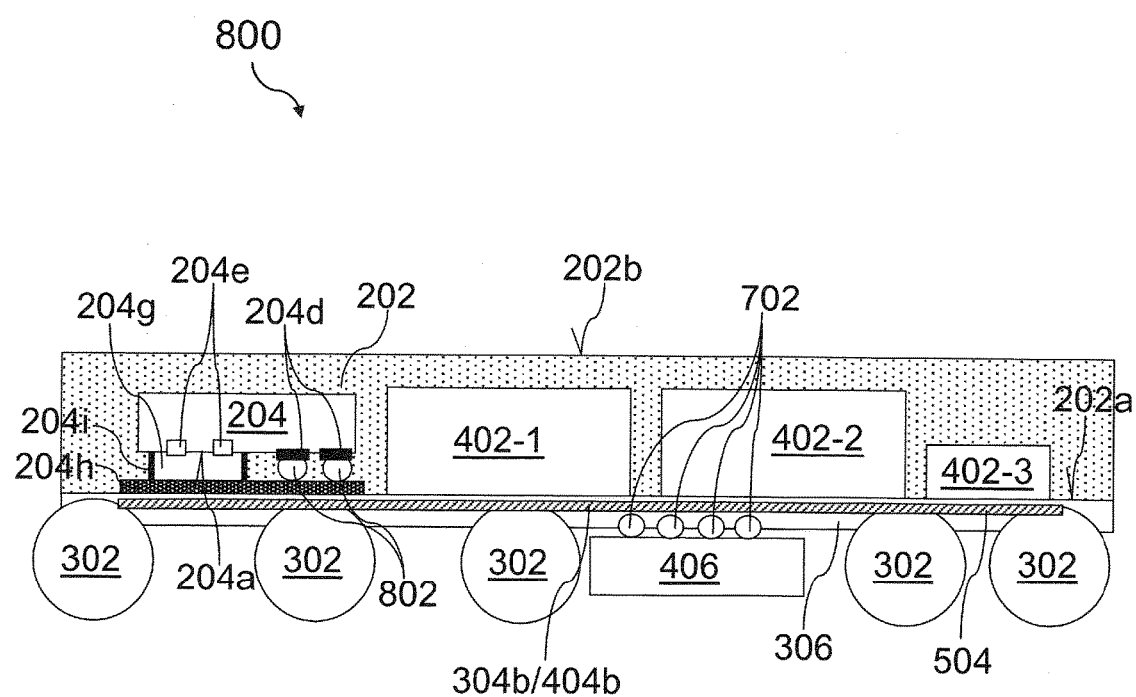
FIG. 8 shows a chip arrangement including a MEMS device including a cap, and a plurality of semiconductor chips at least partially embedded in a mold compound, and at least one second semiconductor chip disposed at a first side of the mold compound.

FIG. 8 shows a chip arrangement 800 including the MEMS device 204 including a cap 204f, and a plurality of semiconductor chips 402-1, 402-2, 402-3 at least partially embedded in the mold compound 202, and at least one second semiconductor chip 406 disposed at the first side 202a of the mold compound 202.

Reference signs in FIG. 8 that are the same as in FIG. 7 denote the same or similar elements as in FIG. 7. Thus, those elements will not be described in detail again here; reference is made to the description above. The various effects described above in relation to the chip arrangement 700 shown in FIG. 7 may be analogously valid for the chip arrangement 800 shown in FIG. 8. Differences between FIG. 8 and FIG. 7 are described below.

In the chip arrangements 200 to 700, the MEMS device 204 may include the cap 204f, which may be configured to encapsulate the at least one MEMS structure 204e, for example, within the cavity 204g. The cap 204f may seal and/or shield the at least one MEMS structure 204e, for example, from moisture, dust and/or mechanical damage. As such, the cap 204f may be dense. For example, the cap 204f may be include, or may consist of, one or more materials that may be packed compactly and/or tightly. By way of another example, the cap 204f may include, or may be, a structure having a rigid constitution.

The cap 204f of the MEMS device 204 may be replaced by a foil 204h (e.g. a foil including, or consisting of, a metal or metal alloy, e.g. metal foil, e.g. a copper foil), e.g. as shown in FIG. 8. The foil 204h (e.g. metal foil, e.g. copper foil) may seal and/or shield the at least one MEMS structure 204e, e.g. within the cavity 204g. In other words, the foil 204h may be configured to provide protection (e.g. mechanical protection and/or protection against moisture, dust, etc.) to the at least one MEMS structure 204e of the MEMS device 204.

The foil 204h may seal the at least one MEMS structure 204e (e.g. within the cavity 204g) by means of a sealing structure 204i disposed laterally adjacent to the at least one MEMS structure 204e (e.g. surrounding the at least one MEMS structure 204e) and at the first side 204a of the MEMS device 204, as shown in FIG. 8. The sealing structure 204i may, for example, fix the foil 204h and the MEMS device 204 (e.g. the first side 204a of the MEMS device 204) to each other. The sealing structure 204i may be glued and/or soldered to the foil 204h (e.g. metal foil, e.g. copper foil) and/or to the MEMS device 204 (e.g. the first side 204a of the MEMS device 204).

The least one electrically conductive contact 204d of the MEMS device 204 may be electrically connected to the foil 204h (e.g. metal foil, e.g. copper foil) by means of at least one electrically conductive interconnect 802.

The at least one electrically conductive interconnect 802 may include, or may be, at least one of a redistribution structure, a bump structure, a pillar structure (e.g. a copper pillar structure), and a metallization (e.g. a bump metallization, e.g. an under-bump metallization), although other intervening structures between the at least one electrically conductive contact 204d and the foil 204h (e.g. metal foil, e.g. copper foil) of the MEMS device 204 may be possible as well.

The foil 204h (e.g. metal foil, e.g. copper foil), the at least one electrically conductive interconnect 802, and the at least one electrically conductive contact 204d may provide an interface (e.g. an electrical interface) for the MEMS device 204. In other words, signals (e.g. electrical signals, power supply potentials, ground potentials, etc.) may be exchanged with the MEMS device 204 via the foil 204h (e.g. metal foil, e.g. copper foil)), the at least one electrically conductive interconnect 802, and the at least one electrically conductive contact 204d. Accordingly, electrical contact with the MEMS device (e.g. with the at least one MEMS structure 204e) may be provided at least by means of the foil 204h of the MEMS device 204.

The foil 204h (e.g. metal foil, e.g. copper foil) may be structured. For example, the foil 24h (e.g. metal foil, e.g. copper foil) may be structured by means of a subtractive process, for example etching. By way of another example, the foil 24h (e.g. metal foil, e.g. copper foil) may be structured by means of an additive process, for example, at least one of a thin-film technology process (e.g. a sputtering process, a plating process, an electroless chemical deposition process, etc.), a lithographic process and a printing process, although other processes may be possible as well.

The chip arrangements 200 to 800, or variants thereof, may be combined with each other to form other chip arrangements. For example, the chip arrangement 600 may be combined with the chip arrangement 400 to form a chip arrangement including a semiconductor chip including at least one through-via and a MEMS device or another semiconductor chip stacked above the semiconductor chip. The semiconductor chip and the stacked MEMS device or stacked other semiconductor chip may further be disposed laterally adjacent to at least one other MEMS device and/or at least one other semiconductor chip, and these may be at least partially embedded in a mold compound. Other examples of chip arrangements may be possible by combining chip arrangements 200 to 800, or variants thereof.

Figure 9:
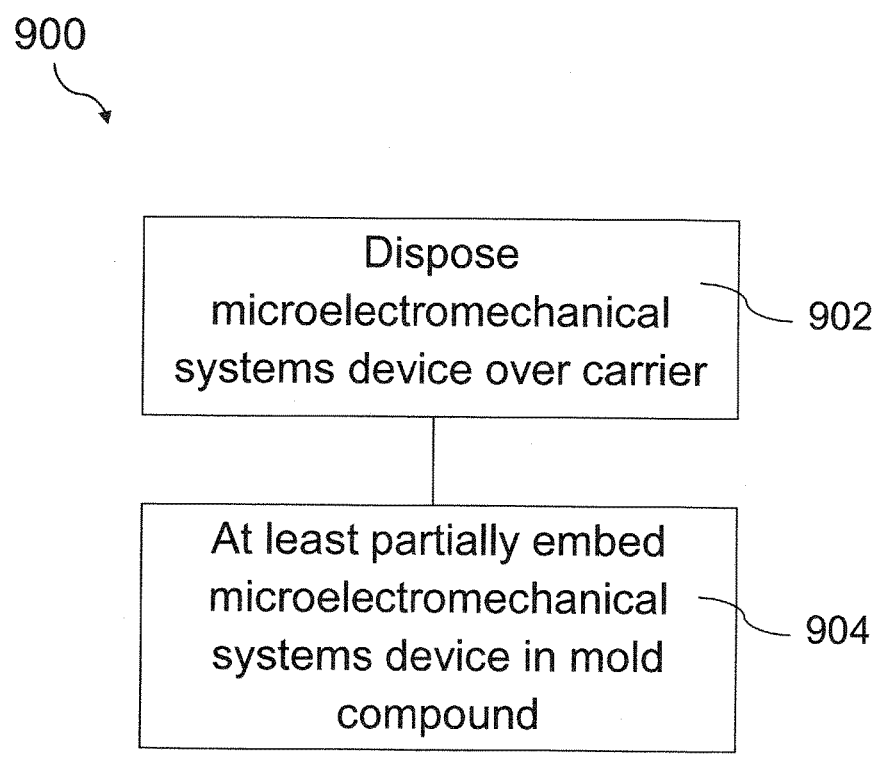
FIG. 9 shows a method for manufacturing a chip arrangement.

FIG. 9 shows a method 900 for manufacturing a chip arrangement.

The method 900 may, for example, be used to manufacture at least one of the chip arrangements 200 to 800 shown in FIG. 2 to FIG. 8, or variants thereof.

The method 900 may include: disposing a MEMS device over a carrier (in 902); and at least partially embedding MEMS device in a mold compound (in 904).

As described above, the method 900 may, for example, be used to manufacture at least one of the chip arrangements 200 to 800 shown in FIG. 2 to FIG. 8. Accordingly, disposing the MEMS device over the carrier (in 902) (e.g. a mold carrier) may include disposing the MEMS device and at least one semiconductor chip (e.g. the at least one semiconductor chip 402 shown in FIG. 4 to FIG. 8) over the carrier (e.g. mold carrier).

At least partially embedding MEMS device in the mold compound (in 904) may, for example, include a compression molding process (which may also be referred to as a compression mold flow process). This may, in some examples, be followed by a curing process (e.g. to cure the mold compound).

As described above, the method 900 may be used to manufacture at least one of the chip arrangements 200 to 800 shown in FIG. 2 to FIG. 8, or variants thereof. The description that follows provides an example of manufacturing the chip arrangement 800 shown in FIG. 8.

As described above, the method 900 for manufacturing the chip arrangement may include disposing the MEMS device over the carrier (in 902). In relation to the chip arrangement 800 shown in FIG. 8, disposing the MEMS device over the carrier (in 902) may include disposing the plurality of semiconductor chips 402-1, 402-2, 402-3 and the foil 204*h* over the carrier (e.g. mold carrier). The foil 204*h* (e.g. metal foil, e.g. copper foil) may be disposed laterally adjacent to the plurality of semiconductor chips 402-1, 402-2, 402-3. A side of the foil 204*h* facing away from the carrier may or may not be structured.

Disposing the MEMS device over the carrier (in 902) may further include disposing the MEMS device 204 over the foil 204*h* (e.g. metal foil, e.g. copper foil), wherein the foil 204*h* may seal the at least one MEMS structure 204*e* of the MEMS device. In this regard, the first side 204*a* of the MEMS device 204 may face the foil 204*h*.

The foil 204*h* (e.g. metal foil, e.g. copper foil) may seal the at least one MEMS structure 204*e* of the MEMS device 204 by means of the sealing structure 204*i*, which may be soldered and/or glued to the MEMS device 204 (e.g. the first side 204*a* of the MEMS device 204). In other words, the MEMS device 204 may be fixed to the foil 204*h* (e.g. metal foil, e.g. copper foil) by means of the sealing structure 204*i*.

The MEMS device 204, which may be disposed over the foil 204*h*, may include at least one electrically conductive interconnect 802, which may be configured to electrically connect the foil 204*h* (e.g. metal foil, e.g. copper foil) and the MEMS device 204 to each other.

As described above, the method 900 for manufacturing the chip arrangement may include at least partially embedding MEMS device in a mold compound (in 904). In relation to the chip arrangement 800 shown in FIG. 8, at least partially embedding MEMS device in a mold compound (in 904) may include depositing a mold compound over the plurality of semiconductor chips 402-1, 402-2, 402-3, the foil 204*h*, and the MEMS device, and at least partially encapsulating the plurality of semiconductor chips 402-1, 402-2, 402-3, the foil 204*h*, and the MEMS device in the mold compound. A side of the mold compound facing the carrier may be at least substantially flush (namely, at least substantially co-planar) with a side of the foil 204*h* (e.g. metal foil, e.g. copper foil) facing the carrier.

The method 900 may further include removing the carrier. The method 900 may further include forming an interface (e.g. electrical interface) to the MEMS device. This may, for example, include forming at least one of an insulating layer (e.g. the insulating layer 306 shown in FIG. 4 to FIG. 8, including the dielectric and/or solder stop layers), an interconnect structure (e.g. the interconnect structures 304, 404, 504 shown in FIG. 4 to FIG. 8) and at least one electrical connector (e.g. the at least one electrical connector 302 shown in FIG. 4 to FIG. 8).

According to various examples presented herein, a chip arrangement may be provided. The chip arrangement may include: a mold compound; and a microelectromechanical systems device at least partially embedded in the mold compound.

The mold compound may include a plastic material.
The mold compound may include a resin.
The resin may include an epoxy resin.
The mold compound may have a first side and a second side opposite the first side, and the chip arrangement may further include: at least one electrical connector disposed at the first side of the mold compound.

The at least one electrical connector may include at least one solder ball.

The at least one electrical connector may include a ball grid array of solder balls.

The chip arrangement may further include: an interconnect structure configured to electrically couple the microelectromechanical systems to the at least one electrical connector.

The interconnect structure may include at least one through-via extending through at least a part of the microelectromechanical systems device.

The interconnect structure may include a redistribution structure disposed at the first side of the mold compound, the second side of the mold compound, or both.

The interconnect structure may include at least one through-via extending through at least a part of the mold compound.

The at least one through-via may extend from the first side of the mold compound to the second side of the mold compound.

The at least one through-via may be disposed laterally adjacent to the microelectromechanical systems device.

The chip arrangement may further include: at least one semiconductor chip at least partially embedded in the mold compound.

A lateral extent of the microelectromechanical systems device may be less than or equal to a lateral extent of the at least one semiconductor chip.

The at least one semiconductor chip may be disposed laterally adjacent to the microelectromechanical systems device.

The microelectromechanical systems device and the at least one semiconductor chip may be arranged as a die stack.

The microelectromechanical systems device may be disposed laterally within a boundary of the at least one semiconductor chip.

The at least one semiconductor chip may include at least one of a logic chip, an application-specific integrated circuit, a passive device, and an active device.

The chip arrangement may further include: a second interconnect structure configured to electrically couple the microelectromechanical systems device to the at least one semiconductor chip.

The second interconnect structure may include at least one through-via extending through at least a part of the microelectromechanical systems device.

The mold compound may have a first side and a second side opposite the first side, and the second interconnect structure may include a redistribution structure disposed at the first side of the mold compound or the second side of the mold compound, or both.

The second interconnect structure may include at least one through-via extending through at least a part of the at least one semiconductor chip.

The microelectromechanical systems device and the at least one semiconductor chip may be arranged as a die stack, and the second interconnect structure may include at least one conductive interconnect disposed between the at least one semiconductor chip and the microelectromechanical systems device.

The second interconnect structure may include at least one through-via extending through at least a part of the mold compound.

The mold compound may have a first side and a second side opposite the first side, and the chip arrangement may further include: at least one electrical connector disposed at the first side of the mold compound; and a third interconnect structure configured to electrically couple the at least one semiconductor chip to the at least one electrical connector.

The third interconnect structure may include a redistribution structure disposed at the first side of the mold compound.

The mold compound may have a first side and a second side opposite the first side, and the chip arrangement may further include: at least one second semiconductor chip disposed over the first side of the mold compound or the second side of the mold compound, or both.

The at least one second semiconductor chip may be configured as a daughter die.

The at least one second semiconductor chip may be electrically coupled to the microelectromechanical systems device.

The microelectromechanical systems device may include at least one microelectromechanical systems structure and a cap configured to encapsulate the at least one microelectromechanical systems structure.

The microelectromechanical systems device may include at least one microelectromechanical systems structure and a metal foil configured to seal the at least one microelectromechanical systems structure.

The chip arrangement may be configured as a chip package.

The chip arrangement may be configured as an embedded wafer level ball grid array package.

According to various examples presented herein, a method for manufacturing a chip arrangement may be provided. The method may include: disposing a microelectromechanical systems device over a carrier; and at least partially embedding the microelectromechanical systems device in a mold compound.

At least partially embedding the microelectromechanical systems device in the mold compound may include a compression molding process.

Disposing the microelectromechanical systems device over the carrier may include disposing the microelectromechanical systems device and at least one semiconductor chip over the carrier.

At least partially embedding the microelectromechanical systems device in the mold compound may include at least partially embedding the microelectromechanical systems and the at least one semiconductor chip in the mold compound.

Disposing the microelectromechanical systems device over the carrier may include disposing a metal foil over the carrier, and disposing the microelectromechanical systems device over the metal foil.

The microelectromechanical systems device may include at least one microelectromechanical systems structure, and wherein the metal foil may be configured to seal the at least one microelectromechanical systems structure.

Various examples and aspects described in the context of one of the chip arrangements or chip packages or methods described herein may be analogously valid for the other chip arrangements or chip packages or methods described herein.

While various aspects have been particularly shown and described with reference to these aspects of this disclosure, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A chip arrangement, comprising:
   a mold compound; and
   a microelectromechanical systems device at least partially embedded in the mold compound where the mold compound directly contacts one or more sidewalls of the microelectromechanical systems device, the microelectromechanical systems device comprising at least one microelectromechanical systems structure at an active side of the microelectromechanical systems device and further comprising a cap disposed over a cavity where an active side of the at least one microelectromechanical systems structure faces the cap, wherein the at least one microelectromechanical systems structure comprises at least one of a sensor, an accelerometer, an oscillator, a surface acoustic wave (SAW) structure, a bulk acoustic wave (BAW) structure, or combinations thereof,
   wherein the cap is disposed over at least a part of an active side of the microelectromechanical systems device so that the active side of the microelectromechanical systems device faces toward the cap, and
   wherein the microelectromechanical systems device is completely enclosed.

2. The chip arrangement of claim 1, wherein the mold compound comprises a plastic material.

3. The chip arrangement of claim 1, wherein the mold compound comprises a resin.

4. The chip arrangement of claim 3, wherein the resin comprises an epoxy resin.

5. The chip arrangement of claim 1, wherein the mold compound has a first side and a second side opposite the first side, the chip arrangement further comprising:
   at least one electrical connector disposed at the first side of the mold compound.

6. The chip arrangement of claim 5, wherein the at least one electrical connector comprises at least one solder ball.

7. The chip arrangement of claim 5, wherein the at least one electrical connector comprises a ball grid array of solder balls.

8. The chip arrangement of claim 5, further comprising:
   an interconnect structure configured to electrically couple the microelectromechanical systems to the at least one electrical connector.

9. The chip arrangement of claim 8, wherein the interconnect structure comprises at least one through-via extending through at least a part of the microelectromechanical systems device.

10. The chip arrangement of claim 8, wherein the interconnect structure comprises a redistribution structure disposed at the first side of the mold compound, the second side of the mold compound, or both.

11. The chip arrangement of claim 8, wherein the interconnect structure comprises at least one through-via extending through at least a part of the mold compound.

12. The chip arrangement of claim 11, wherein the at least one through-via extends from the first side of the mold compound to the second side of the mold compound.

13. The chip arrangement of claim 11, wherein the at least one through-via is disposed laterally adjacent to the microelectromechanical systems device.

14. The chip arrangement of claim 1, further comprising:
   at least one semiconductor chip at least partially embedded in the mold compound.

15. The chip arrangement of claim 14, wherein a lateral extent of the microelectromechanical systems device is less than or equal to a lateral extent of the at least one semiconductor chip.

16. The chip arrangement of claim 14, wherein the at least one semiconductor chip is disposed laterally adjacent to the microelectromechanical systems device.

17. The chip arrangement of claim 14, wherein the microelectromechanical systems device and the at least one semiconductor chip are arranged as a die stack.

18. The chip arrangement of claim 17, wherein the microelectromechanical systems device is disposed laterally within a boundary of the at least one semiconductor chip.

19. The chip arrangement of claim 14, wherein the at least one semiconductor chip comprises at least one of a logic chip, an application-specific integrated circuit, a passive device, and an active device.

20. The chip arrangement of claim 14, further comprising:
a second interconnect structure configured to electrically couple the microelectromechanical systems device to the at least one semiconductor chip.

21. The chip arrangement of claim 20, wherein the second interconnect structure comprises at least one through-via extending through at least a part of the microelectromechanical systems device.

22. The chip arrangement of claim 20, wherein the mold compound has a first side and a second side opposite the first side, and wherein the second interconnect structure comprises a redistribution structure disposed at the first side of the mold compound or the second side of the mold compound, or both.

23. The chip arrangement of claim 20, wherein the second interconnect structure comprises at least one through-via extending through at least a part of the at least one semiconductor chip.

24. The chip arrangement of claim 20, wherein the microelectromechanical systems device and the at least one semiconductor chip are arranged as a die stack, and wherein the second interconnect structure comprises at least one conductive interconnect disposed between the at least one semiconductor chip and the microelectromechanical systems device.

25. The chip arrangement of claim 20, wherein the second interconnect structure comprises at least one through-via extending through at least a part of the mold compound.

26. The chip arrangement of claim 14, wherein the mold compound has a first side and a second side opposite the first side, the chip arrangement further comprising:
at least one electrical connector disposed at the first side of the mold compound; and
a third interconnect structure configured to electrically couple the at least one semiconductor chip to the at least one electrical connector.

27. The chip arrangement of claim 26, wherein the third interconnect structure comprises a redistribution structure disposed at the first side of the mold compound.

28. The chip arrangement of claim 1, wherein the mold compound has a first side and a second side opposite the first side, the chip arrangement further comprising:
at least one second semiconductor chip disposed over the first side of the mold compound or the second side of the mold compound, or both.

29. The chip arrangement of claim 28, wherein the at least one second semiconductor chip is configured as a daughter die.

30. The chip arrangement of claim 28, wherein the at least one second semiconductor chip is electrically coupled to the microelectromechanical systems device.

31. The chip arrangement of claim 1, wherein the microelectromechanical systems device comprises at least one microelectromechanical systems structure and a metal foil configured to seal the at least one microelectromechanical systems structure.

32. The chip arrangement of claim 1, configured as a chip package.

33. The chip arrangement of claim 1, configured as an embedded wafer level ball grid array package.

34. The chip arrangement of claim 1, wherein the cap comprises one or more interconnects disposed therethrough.

* * * * *